(12) United States Patent
Kim et al.

(10) Patent No.: US 8,051,559 B2
(45) Date of Patent: Nov. 8, 2011

(54) METHOD OF MANUFACTURING A MULTI-LAYER BOARD

(75) Inventors: Ki-Hwan Kim, Boryeong-si (KR);
Jong-Kuk Hong, Suwon-si (KR);
Jin-Yong An, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 620 days.

(21) Appl. No.: 12/232,820

(22) Filed: Sep. 24, 2008

(65) Prior Publication Data

US 2009/0236125 A1 Sep. 24, 2009

(30) Foreign Application Priority Data

Mar. 24, 2008 (KR) .................. 10-2008-0027073

(51) Int. Cl.
*H01K 3/10* (2006.01)
*H05K 1/00* (2006.01)
(52) U.S. Cl. .............. 29/852; 29/830; 29/831; 29/832; 29/846; 29/847; 174/250
(58) Field of Classification Search .............. 29/852, 29/832, 830, 831, 846, 847, 874; 174/250, 174/262, 268, 261; 156/272.8, 280; 216/13; 427/97.3
See application file for complete search history.

(56) References Cited

U.S. PATENT DOCUMENTS

| | | | | |
|---|---|---|---|---|
| 4,713,494 A | * | 12/1987 | Oikawa et al. | 174/257 |
| 5,758,413 A | * | 6/1998 | Chong et al. | 29/852 |
| 6,323,439 B1 | * | 11/2001 | Kambe et al. | 174/262 |
| 6,670,009 B1 | * | 12/2003 | Voss | 428/40.1 |

FOREIGN PATENT DOCUMENTS

| | | |
|---|---|---|
| JP | 6-318783 | 11/1994 |
| JP | 2000-323613 | 11/2000 |
| JP | 2004-128029 | 4/2004 |
| KR | 2002-0085999 | 11/2002 |

OTHER PUBLICATIONS

Korean Office Action issued Nov. 30, 2009 in corresponding Korean Patent Application 10-2008-0027073.
Japanese Office Action issued Nov. 9, 2010 in corresponding Japanese Patent Application 2008-232073.

* cited by examiner

*Primary Examiner* — Derris Banks
*Assistant Examiner* — Tai Nguyen

(57) ABSTRACT

A method of manufacturing a multi-layer board is disclosed. The method may include forming a detachable separation layer over a support; forming a first solder resist layer over the separation layer; stacking a metal foil over the first solder resist layer; forming a circuit pattern over the metal foil; forming an insulation part over the first solder resist layer such that the circuit pattern is covered; forming a second solder resist layer over the insulation part; and separating a circuit stack unit, which includes the first solder resist layer, the metal foil, the circuit pattern, the insulation part, and the second solder resist layer, from the support by disconnecting the separation layer and the support. This method uses a simple process to reduce manufacture costs and shorten manufacture times.

6 Claims, 13 Drawing Sheets

METHOD OF MANUFACTURING A MULTI-LAYER BOARD

CROSS-REFERENCE TO RELATED APPLICATIONS

This application claims the benefit of Korean Patent Application No. 10-2008-0027073 filed with the Korean Intellectual Property Office on Mar. 24, 2008, the disclosure of which is incorporated herein by reference in its entirety.

BACKGROUND

1. Technical Field

The present invention relates to a multi-layer board and a method of manufacturing a multi-layer board.

2. Description of the Related Art

In accordance with the trends towards compact sizes in current electronic products, the parts included in the electronic products are also being fabricated in smaller sizes. This in turn may require smaller sizes in the packages mounted with component chips, as well as thinner substrates for the packages. A small thickness in the substrate is also important in terms of minimizing loop inductance, which depends on the physical distances within a circuit. The need to develop a multi-layer circuit board for use in thin, minute semiconductor devices is continuously increasing, especially in the field of semiconductors, where miniaturization is of critical importance.

However, the thin multi-layer circuit board currently under development may entail a complicated manufacturing process and high production costs, while the finished product may not provide high levels of reliability.

SUMMARY

An aspect of the invention provides a method of manufacturing a multi-layer board, as well as a multi-layer board manufactured using the method, which can improve the reliability of the product using a simple process.

Another aspect of the invention provides a method of manufacturing a multi-layer board that includes: forming a detachable separation layer over a support; forming a first solder resist layer over the separation layer; stacking a metal foil over the first solder resist layer; forming a circuit pattern over the metal foil; forming an insulation part over the first solder resist layer such that the circuit pattern is covered; forming a second solder resist layer over the insulation part; and separating a circuit stack unit, which includes the first solder resist layer, the metal foil, the circuit pattern, the insulation part, and the second solder resist layer, from the support by disconnecting the separation layer and the support.

Here, forming the circuit pattern over the metal foil can include: forming a plating resist, which corresponds with the circuit pattern, over the metal foil; forming a plating layer over the metal foil on which the plating resist is formed; removing the plating resist; and removing the metal foil by flash etching.

The method may further include an operation of forming at least one via hole in the insulation part, between the operations for forming the insulation part and forming the second solder resist layer. Forming the separation layer over the support may be achieved by coating silicone over one side of the support.

The support can be a copper clad laminate (CCL). The first solder resist layer can have roughness formed on one side, with the metal foil stacked on facing the one side.

The operation of forming the separation layer over the support can include forming the separation layer symmetrically on both sides of the support. The insulation part can include a multiple number of unit insulation layers.

Yet another aspect of the invention provides a multi-layer board that includes: a first solder resist layer, a circuit pattern formed over the first solder resist layer, an insulation part formed over the first solder resist layer such that the circuit pattern is covered, and a second solder resist layer formed over the insulation part, where the circuit pattern includes a first layer formed by stacking a metal foil, and a second layer formed by plating the metal foil.

Here, the insulation part can be formed of one or more insulation layers, and the insulation part can further include at least one via hole that is formed penetrating the insulation part.

Additional aspects and advantages of the present invention will be set forth in part in the description which follows, and in part will be obvious from the description, or may be learned by practice of the invention.

DETAILED DESCRIPTION

Figure 1:
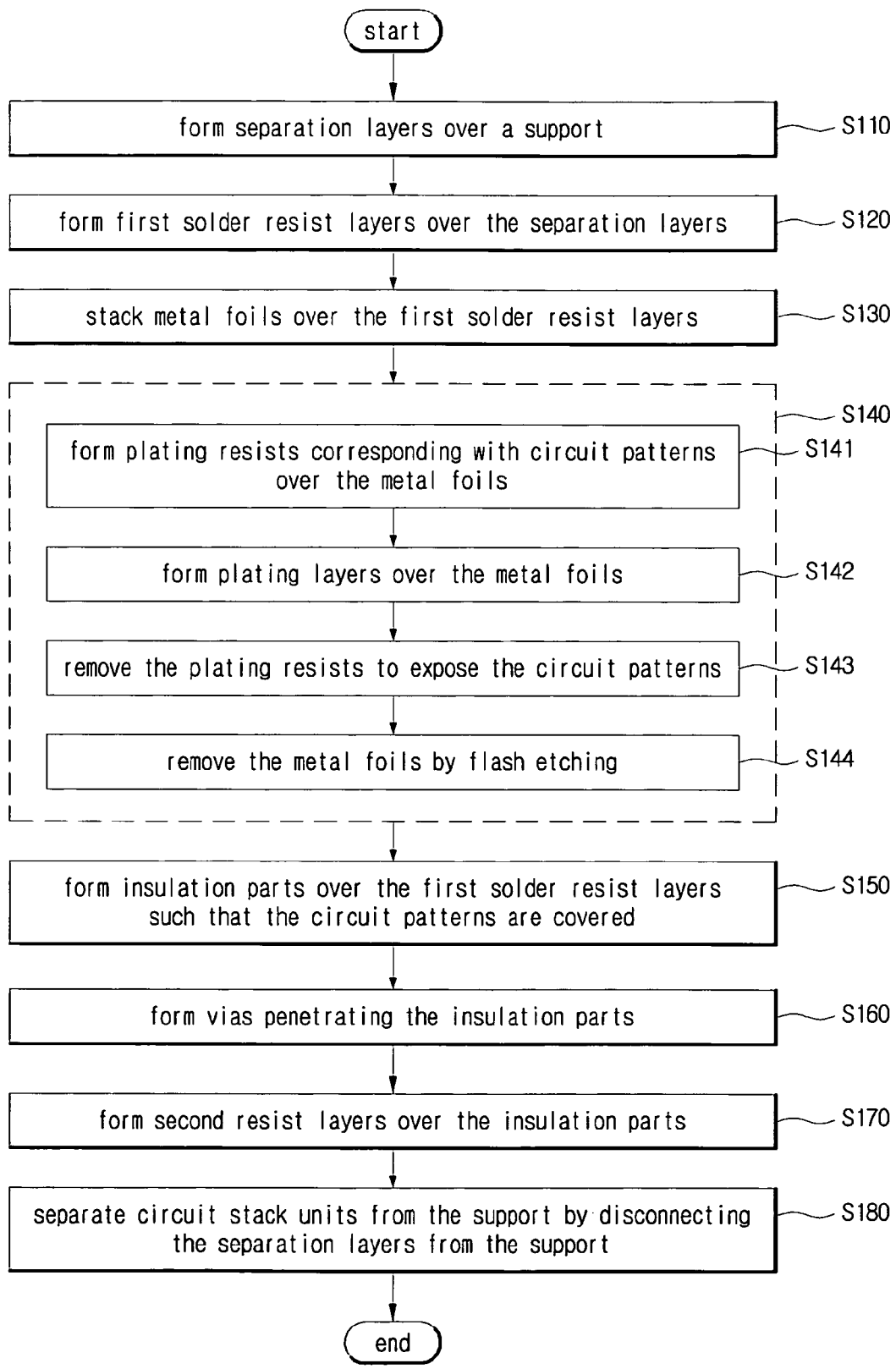
FIG. 1 is a flowchart illustrating a method of manufacturing a multi-layer board according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Certain embodiments of the invention will be described below in more detail with reference to the accompanying drawings.

FIG. 1 is a flowchart illustrating a method of manufacturing a multi-layer board according to an embodiment of the invention, and FIG. 2 through FIG. 12 are cross sectional views each representing a process in a method of manufacturing a multi-layer board according to an embodiment of the invention.

In FIGS. 2 to 12, there are illustrated a support 210, separation layers 220, first solder resist layers 230, metal foils 240, plating resists 250, plating layers 260, circuit patterns 261, vias 280, second solder resist layers 290, insulation parts 270, and circuit stack units 300.

According to this embodiment, separation layers 220 can be formed symmetrically over both sides of a support 210, and each subsequent operation for manufacturing a multi-layer board can be performed over both sides of the support 210 in symmetry with respect to the support 210. It is apparent to those skilled in the art that it is also possible to form a separation layer 220 on just one side of the support 210 and perform the subsequent operations for manufacturing a multi-layer board, such as forming a metal foil 240 or forming a circuit pattern 261, etc., over just the one side of the support 210. FIGS. 2 to 12, however, will illustrate an example in which the procedures for manufacturing a multi-layer board are performed symmetrically over both sides of the support 210. Furthermore, it will be understood that the method of manufacturing a multi-layer board described in this specification may apply to those cases where the procedures are performed over both sides of the support 210 in symmetry with respect to the support 210, even when this is not specifically mentioned.

Figure 2:
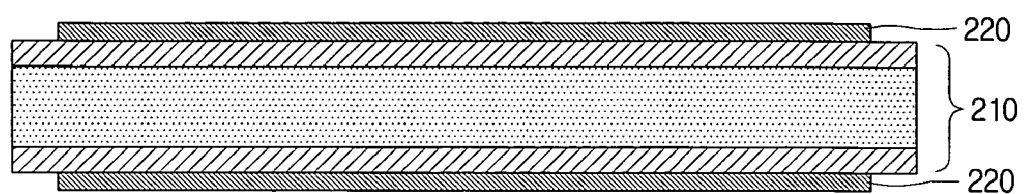
FIG. 2, FIG. 3, FIG. 4, FIG. 5, FIG. 6, FIG. 7, FIG. 8, FIG. 9, FIG. 10, FIG. 11, and FIG. 12 are cross sectional views each representing a process in a method of manufacturing a multi-layer board according to an embodiment of the invention.

A method of manufacturing a multi-layer board according to this embodiment may first include, as illustrated in FIG. 2, forming separation layers 220 over both sides of the support 210 (S110). The support 210 can form the base for forming the multi-layer board and can serve to support the intermediate products in forming the board, during transportation between the respective equipment for the required processes. As the support 210 is utilized in the transporting process, the support 210 may also be referred to as a carrier. In this embodiment, the support 210 can be a copper clad laminate (CCL). However, it is apparent that materials other than a copper clad laminate may also be used for the support 210, if they are congruent with the purpose of the support 210 in embodiments of the invention.

As shown in FIG. 2, the separation layers 220 can be formed on one and the other side of the support 210 in a symmetric configuration. The separation layers 220 can be made from a material that allows detaching. In this embodiment, the separation layers 220 can be formed by coating a silicone liquid. By forming the separation layers 220 from a material that provides a detachable quality as described above, the circuit stack units 300 may readily be separated from the support 210 later. Besides the method of coating a silicone liquid, the separation layers 220 may also be formed by attaching a detachable tape, or by using detachable paper or copper foils, etc. As such, any material that provides a detachable quality may advantageously be used in forming the separation layers 220.

Figure 3:
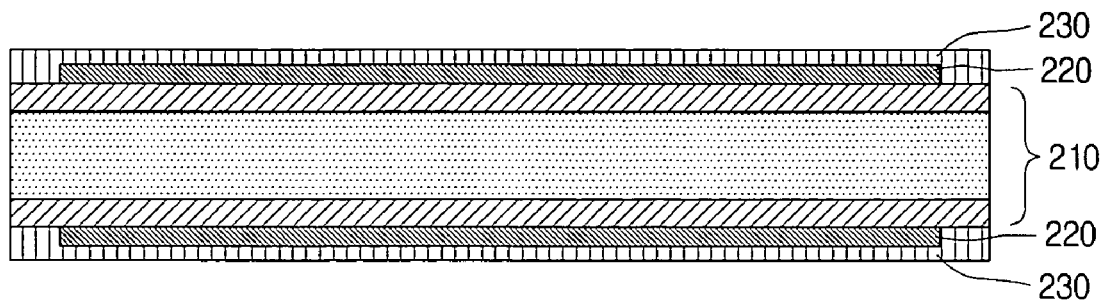

Next, as illustrated in FIG. 3, first solder resist layers 230 can be formed over the separation layers 220 such that the separation layers 220 are covered (S120). In this embodiment, a first solder resist layer 230 can be an insulation layer which, together with a second solder resist layer 290 described later, may form the outermost layers when the manufacture of a multi-layer board is completed. Throughout the descriptions in this specification, the first solder resist layers 230 and second solder resist layers 290 will be meant to convey the meanings set forth above.

According to this embodiment, a first solder resist layer 230 can be a film type solder resist (SR), liquid type solder resist, or a dry film solder resist (DFSR). The first solder resist layer 230 can be made from any of various insulating materials, such as polyimide, FR4, ABF, BT (Bismaleimide-Triazine), polytetrafluoroethylene (PTFE), and liquid crystal polymers (LCP), etc.

Figure 4:
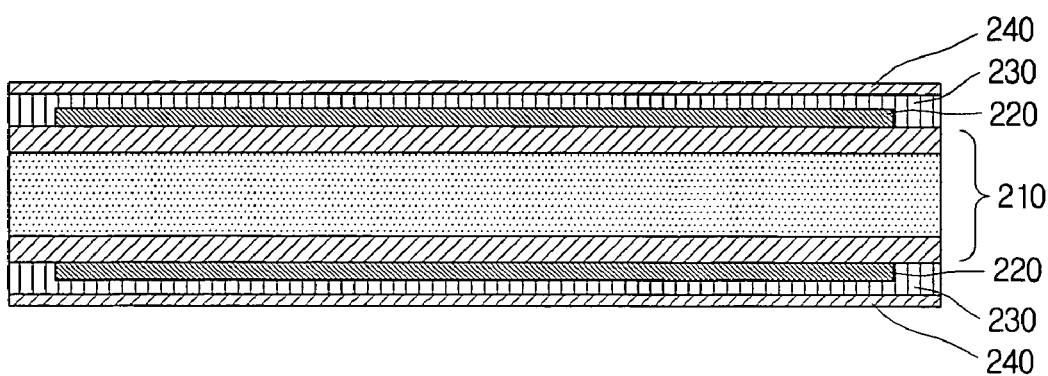

After the first solder resist layers 230 are formed, metal foils 240 can be stacked over the first solder resist layers 230 (S130), as illustrated in FIG. 4. According to this embodiment, the metal foils 240 can be thin foils of copper. A metal foil 240 can be stacked facing the surface of a first solder resist layer 230 on which roughness has been formed, in order that a desired level of adhesion may be obtained between the first solder resist layer 230 and the metal foil 240.

Figure 5:
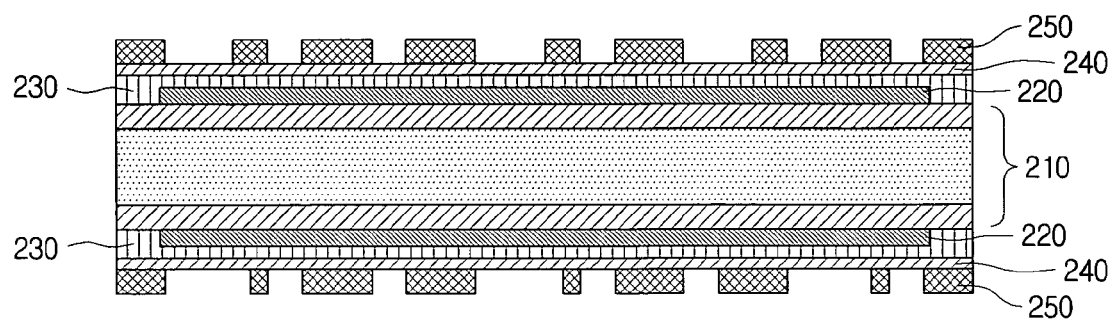

Next, circuit patterns can be formed on the metal foils 240 (S140). According to this embodiment, the forming of the circuit patterns on the metal foils 240 may include four main operations. First, as illustrated in FIG. 5, plating resists 250 can be formed over the metal foils 240 that correspond with the circuit patterns (S141). That is, the plating resists 250 can be formed in portions excluding those where the circuit patterns are to be formed. In this way, the plating resists 250, formed in areas outside the portions where the circuit patterns are to be formed, may enable the forming of plating layers 260 in the areas where the circuit patterns are to be formed.

Figure 6:
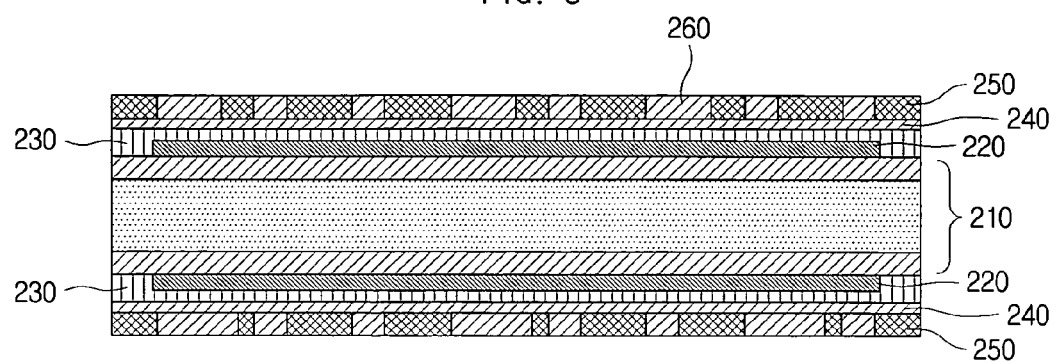

Then, as illustrated in FIG. 6, plating layers 260 can be formed over the metal foils 240 on which the plating resists 250 are formed (S142). According to this embodiment, the plating layers 260 may be formed by electroplating, using the metal foils 240 as electrodes. As described above, the plating layers 260 can be formed in portions excluding the portions where the plating resists 250 are formed, to allow the forming of circuit patterns 261 later.

Figure 7:
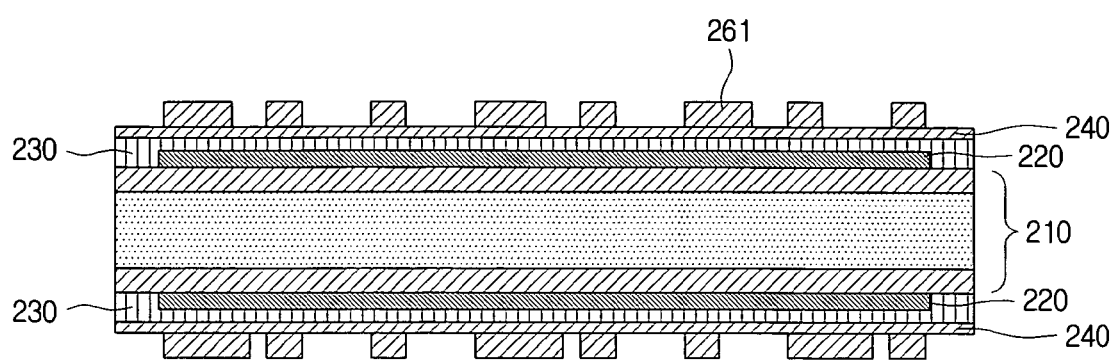
Figure 8:
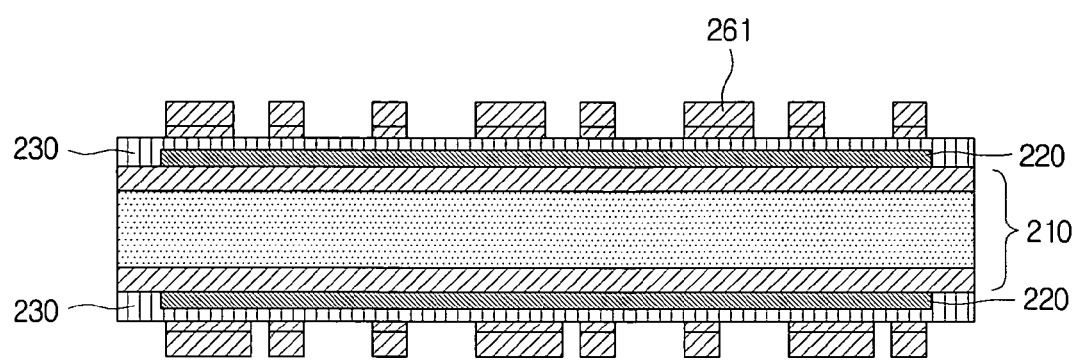

Next, as illustrated in FIG. 7, the plating resists 250 can be removed (S143). When the plating resists 250 are removed, the circuit patterns 261, formed by the plating layers 260, can be exposed. Here, the removal of the plating resists 250 can cause not only the circuit patterns 261 but also the metal foils 240 to be exposed to the exterior. Thus, as illustrated in FIG. 8, the exposed metal foils 240 can be removed by flash etching (S144). Flash etching is a type of etching process that is well known to those skilled in the art and therefore will not be described here in detail.

Figure 9:
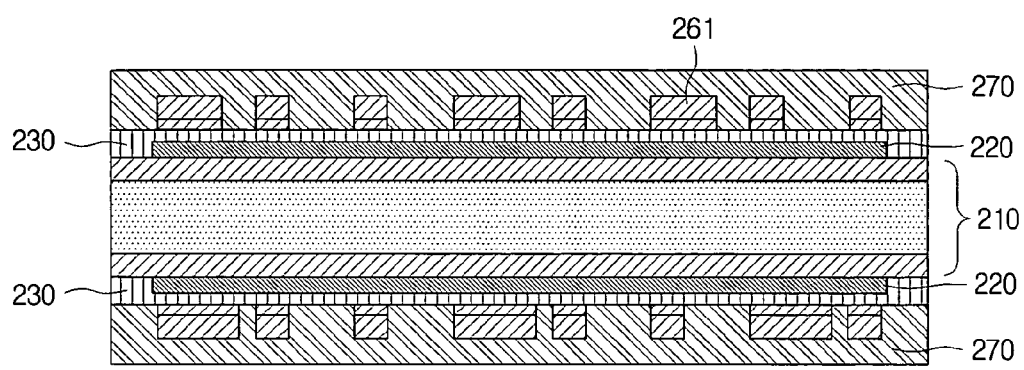
Figure 10:
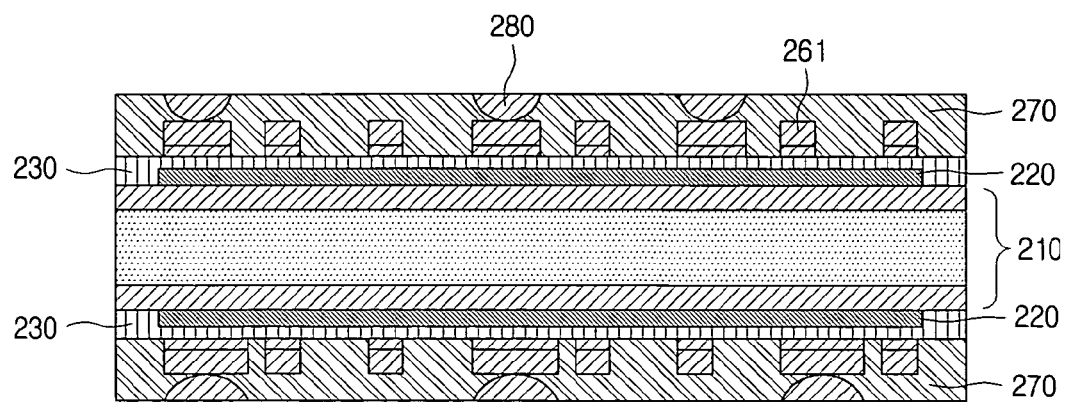

Next, as shown in FIG. 9, insulation parts 270 can be formed over the first solder resist layers 230 such that the circuit patterns 261 are covered (S150). Here, any material that has an insulating property can be used to form the insulation parts 270. After the insulation parts 270 are formed, vias 280 can be formed which penetrate the insulation parts 270 (S160), as illustrated in FIG. 10. A via 280 can be used for interconnecting different layers. The process for forming vias 280 is well known to those skilled in the art and therefore will not be described here in detail. In certain embodiments, the insulation part 270 described above can include one or more unit insulation layers 271-275, where a circuit pattern may be formed over each of the unit insulation layers 271-275, and vias may be formed in each of the unit insulation layer 271-275.

Figure 11:
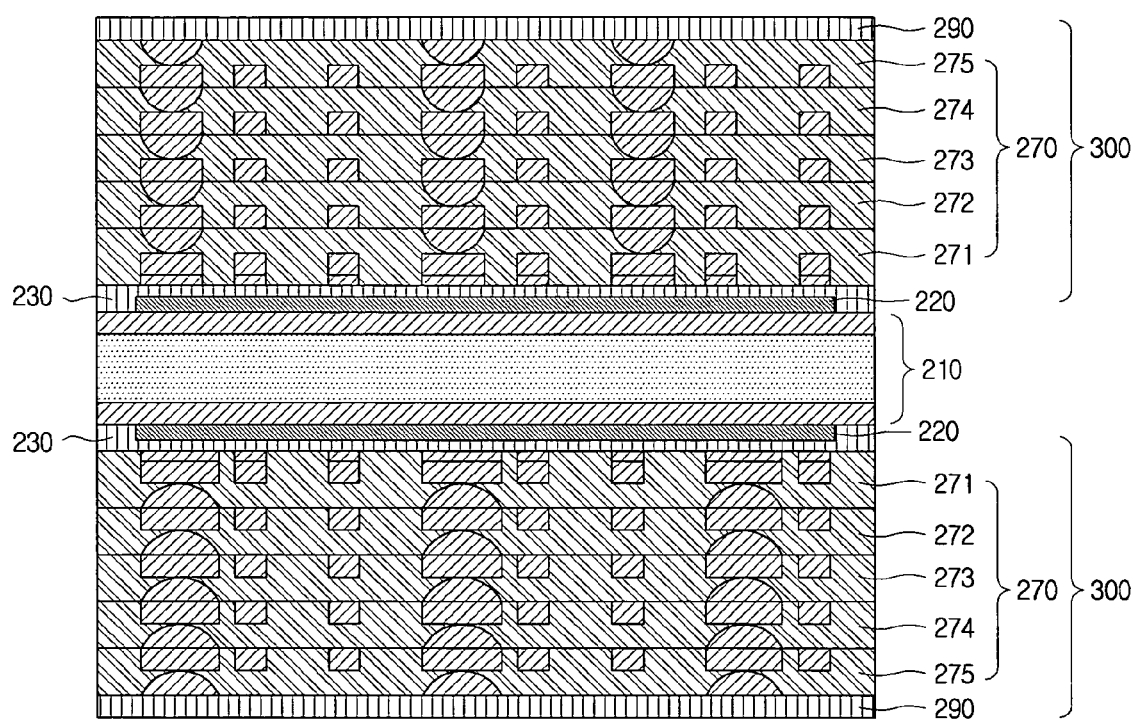

After the insulation parts 270 are formed as described above, second solder resist layers 290, which can form the outermost layers, can be formed over the insulation parts 270 (S170), as illustrated in FIG. 11. According to this embodiment, the first solder resist layers 230 and the second solder resist layers 290 can be made from the same material. By thus forming the first solder resist layers 230 and the second solder resist layers 290 from the same material, a multi-layer board based on this embodiment can itself be made substantially symmetrical, so that warpage in the board can be reduced and mounting on the board can be implemented with higher reliability.

Here, the first solder resist layer 230, metal foil 240, circuit pattern 261, vias 280, second solder resist layer 290, and insulation part 270 will be referred to collectively as a circuit stack unit 300. Subsequent references to a circuit stack unit 300 will be intended to convey the same meaning.

Figure 12:
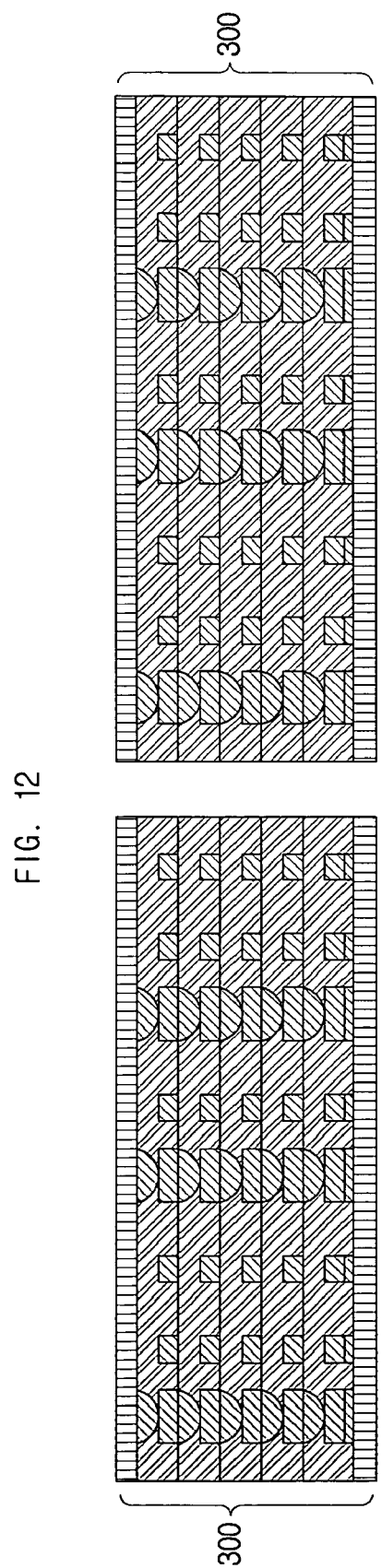

After the second solder resist layers 290 are formed, the separation layers 220 and the support 210 can be disconnected, to separate the circuit stack units 300 from the support 210 (S180). Since the separation layers 220 may be formed from a material that allows detaching as described above, the circuit stack units 300 may readily be separated from the support 210. Referring to FIG. 12, since the method of manufacturing a multi-layer board according to this particular embodiment may be carried out with each operation performed symmetrically about the support 210 on both sides, the separating can result in two multi-layer boards. If the procedures for manufacturing a multi-layer board, such as forming the separation layer 220, the metal foil 240, etc., are performed for only one side of the support 210, just one multi-layer board may be obtained, as is apparent to those skilled in the art.

Figure 13:
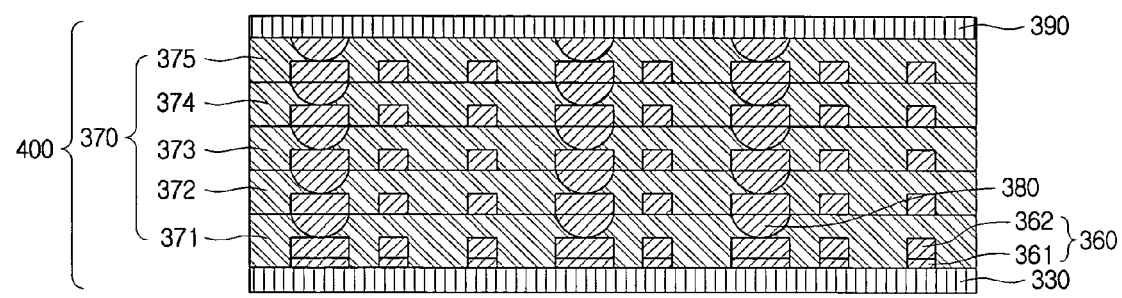
FIG. 13 is a cross sectional view of a multi-layer board according to an embodiment of the invention.

A description will now be provided, with reference to FIG. 13, on the structure of a multi-layer board based on an embodiment of the invention. FIG. 13 is a cross sectional view of a multi-layer board according to an embodiment of the invention. The multi-layer board of FIG. 13 may include a first solder resist layer 330, a circuit pattern 360, a first layer 361, a second layer 362, a second solder resist layer 390, an insulation part 370, unit insulation layers 371-375, and vias 380.

The multi-layer board according to this embodiment illustrated in FIG. 13 can be manufactured using the method of manufacturing a multi-layer board illustrated in FIG. 1 through FIG. 12. As such, redundant descriptions may be omitted in the following descriptions.

In the multi-layer board according to this embodiment, the first solder resist layer 330 and the second solder resist layer 390 can be made from the same material. The first solder resist layer 330 and second solder resist layer 390 formed symmetrically in this way can provide a substantially symmetrical configuration in the multi-layer board, so that warpage in the board can be avoided and the reliability of the product for mounting can be improved, as already described above.

According to this embodiment, the circuit pattern 360 formed over the first solder resist layer 330 can include a first layer 361, formed by stacking a metal foil, and a second layer 362, formed by plating over the metal foil. The first layer 361 can be formed by stacking a metal foil, which can be a thin copper foil layer. The two layers 361, 362 included in the circuit pattern 360 formed over the first solder resist layer 330 can easily be recognized when seen in a cross section of the multi-layer board. This is a unique feature of a multi-layer board formed by a method according to an embodiment of the invention. That is, if the first solder resist layer 330, first layer 361, and second layer 362 can be observed in a cross section of a multi-layer board, it may be determined that the multi-layer board is based on an embodiment of the invention.

As set forth above, certain embodiments of the invention can provide a method of manufacturing a coreless multi-layer board that entails a simple process, reduced manufacture costs, and shortened manufacture times. Certain embodiments of the invention provide a multi-layer board manufactured by such a method.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a multi-layer board, the method comprising:
    forming a detachable separation layer over a support;
    forming a first solder resist layer over the separation layer;
    stacking a metal foil over the first solder resist layer;
    forming a circuit pattern over the metal foil;
    forming an insulation part over the first solder resist layer such that the circuit pattern is covered;
    forming a second solder resist layer over the insulation part; and
    separating a circuit stack unit from the support by disconnecting the separation layer and the support, the circuit stack unit comprising the first solder resist layer, the metal foil, the circuit pattern, the insulation part, and the second solder resist layer.

2. The method of claim 1, wherein forming the circuit pattern over the metal foil comprises:
    forming a plating resist over the metal foil, the plating resist corresponding with the circuit pattern;
    forming a plating layer over the metal foil having the plating resist formed thereon;
    removing the plating resist; and
    removing the metal foil by flash etching.

3. The method of claim 1, wherein the support is a copper clad laminate (CCL).

4. The method of claim 1, wherein the first solder resist layer has roughness formed on one side thereof,
    and the metal foil is stacked on facing the one side.

5. The method of claim 1, wherein forming the separation layer over the support comprises:
    forming the separation layer symmetrically on both sides of the support.

6. The method of claim 1, wherein the insulation part comprises a plurality of unit insulation layers.

* * * * *